United States Patent [19]
Liu et al.

[11] Patent Number: 5,698,862
[45] Date of Patent: Dec. 16, 1997

[54] STRUCTURE OF THE HETEROSTRUCTURE-EMITTER AND HETEROSTRUCTURE-BASE TRANSISTOR (HEHBT)

[75] Inventors: Wen-Chau Liu, Tainan; Wen-Shiung Lour, Chi-Lung; Jung-Hui Tsai, Tainan, all of Taiwan

[73] Assignee: National Science Counsel of Republic of China, Taipei, Taiwan

[21] Appl. No.: 766,711

[22] Filed: Dec. 13, 1996

[51] Int. Cl.$^6$ .................. H01L 29/201; H01L 29/737; H01L 29/08
[52] U.S. Cl. ................. 257/14; 257/197; 257/198; 257/23
[58] Field of Search .............. 257/12, 14, 26, 257/23, 196–198

[56] References Cited

U.S. PATENT DOCUMENTS 5,003,366  3/1991  Mishima et al. .................... 257/197

FOREIGN PATENT DOCUMENTS 4-167435  6/1992  Japan ................................. 257/197

OTHER PUBLICATIONS

Chen, et al., "High Current Gain, Low Offset Voltage Heterostructure Emitter Bipolar Transistor," IEEE Electron Device Letters, vol. 15, No. 9, Sep. 1994, pp. 336–338.

Wen–Chau Liu, et al.; "An Improved Heterostructure–Emitter Bipolar Transistor (HEBT)"; IEEE Electron Device Letters, vol. 12, No. 9, Sep. 1991 pp. 474–476.

T. Tanoue, et al.; "A Triple–Well Resonant–Tunneling Diode for Multiple–Valued Logic Application"; IEEE Electron Device Letters, vol. 9, No. 8, Aug. 1988, pp. 365–367.

C. R. Liu, et al.; "A Novel AMorphous Silicon Doping Superlattice Device with Double Switching Characteristics for Multiple–Valued Logic Applications"; IEEE Electron Dev. Ltrs., vol. 14, No. 8, Aug. 1993: pp. 391–393.

Shey–Shi Lu, et al.: "High–Current–Gain Small–Offset––Voltage $In_{0.49}Ga_{0.51}P$/GaAs Tunneling Emitter Bipolar Transistors Grown by Gas Source Molecular Beam Epitaxy"; IEEE Electron Device Ltrs., vol. 13, No. 9, Sep. 1992, pp. 468–470.

*Primary Examiner*—Jerome Jackson
*Assistant Examiner*—John Guay
*Attorney, Agent, or Firm*—David E. Dougherty, Esquire

[57] ABSTRACT

The invention presents a structure of heterostructure-emitter and heterostructure-base transistor. The device structure are, from bottom upward in succession, a substrate, a buffer layer, a collector layer, a base layer, a quantum well, an emitter layer, a confinement layer and an ohmic contact layer. Of them, except the quantum well which is made of InGaAs and the confinement layer which is formed by AlGaAs, the rest are all made of GaAs material. Base on the design of the heterostructure of base and emitter, a transistor of such structure, under normal operation mode, possesses high current gain and low offset voltage so as to reduce undesirable power consumption. In addition, under the inverted operation mode, the interesting multiple S-shaped negative-differential-resistance may be obtained due to the avalanche multiplication and two-stage carrier confinement effects. These properties cause the device of the invention to provide good promise for amplification, oscillator, and multiple-valued logic circuits applications.

8 Claims, 8 Drawing Sheets

1

STRUCTURE OF THE HETEROSTRUCTURE-EMITTER AND HETEROSTRUCTURE-BASE TRANSISTOR (HEHBT)

BACKGROUND OF THE INVENTION

1. Field of the invention

This invention related the fabrication process and structure of the heterostructure-emitter and heterostructure-base transistor (HEHBT). Particularly, the interesting multiple negative-differential-resistance (NDR) phenomenon is obtained under inverted operation mode at room temperature. In addition, under the normal operation mode, this device can show the excellent transistor performances including high current gain and low offset voltage, etc.

2. Description of the prior art

In today's world, wireless communication and portable devices are needed greatly by public. Consequently, it is important to design the devices with low power consumption. Presently, the decrease of the number of devices on one chip and increase of device functions become an attractive motivation in the circuit design.

SUMMARY OF THE INVENTION

From the view point as mentioned above this invention, the inventor develop a new functional heterostructure-emitter and heterostructure-base transistor (HEHBT). Under the normal operation mode, this device can show the excellent transistor performances including high current gain and low offset voltage,etc. On the other hand, the interesting multiple negative-differential-resistance (NDR) phenomenon is observed under inverted operation mode at room temperature. The NDR phenomenon is suited for the multiple-valued logic applications. The multiple-valued logic circuit, compared with conventional digital logic circuit (including both high(1) and low(0) states), could process other stable states. In brief, the multiple-valued logic circuit could provide more than two operation points. Such circuit and speed up data processing, i.e., Fuzzy control. Furthermore, the invention could reduce the circuit complexity and the undesirable power consumption in circuit application. One of the purposes of this invention is to increase the emitter injection efficiency and current gain and reduce the emitter-collector offset voltage under the normal operation mode. The second purpose of the invention is to generate the interesting multiple NDR phenomenon when the device is under inverted operation mode. This can be used in the multiple-valued logic circuit applications. Thus, the heterostructure-emitter and herostructure-base transistor of the invention has a good potential for amplification, oscillation, and multiple-valued logic circuit applications. The device can improve the transistor performances and extend the scope of its applications.

BRIEF DESCRIPTION OF THE DRAWINGS

The invention, as well as its many advantages, may be further understood by the following detailed description and drawings in which.

ILLUSTRATIONS OF THE SIGNS

10—heterostructure-emitter and heterostructure-base transistor of the invention
12—Substrate of GaAs material
14—GaAs buffer layer
16—GaAs collector layer
18—GaAs base layer
20—quantum well formed by InGaAs material
22—GaAs emitter layer
24—Confinement layer formed by AlGaA material
26—ohmic contact layer formed by GaAs material
E—emitter
B—base
C—collector
$V_{BC}$—the applied voltage between base and collector
$V_{BE}$—the applied voltage between base and emitter
$\Delta E_{C1}$—conduction band discontinuity between GaAs confinement layer and GaAs emitter layer
$\Delta E_{C2}$—conduction band discontinuity between InGaAs quantum well and GaAs base layer
$\Delta E_{v1}$—valence band discontinuity between AlGaAs confinement layer and GaAs emitter layer
$\Delta E_{v2}$—valence band discontinuity between InGaAs quantum well and GaAs base layer
$V_{S1}$—switching voltage of the first negative-differential-resistance
$V_{H1}$—holding voltage of the first negative-differential-resistance
$V_{S2}$—switching voltage of the second negative-differential-resistance
$V_{H2}$—holding voltage of the second negative-differential-resistance

DETAILED DESCRIPTION OF THE PREFERRED EMBODIMENT

Figure 1:
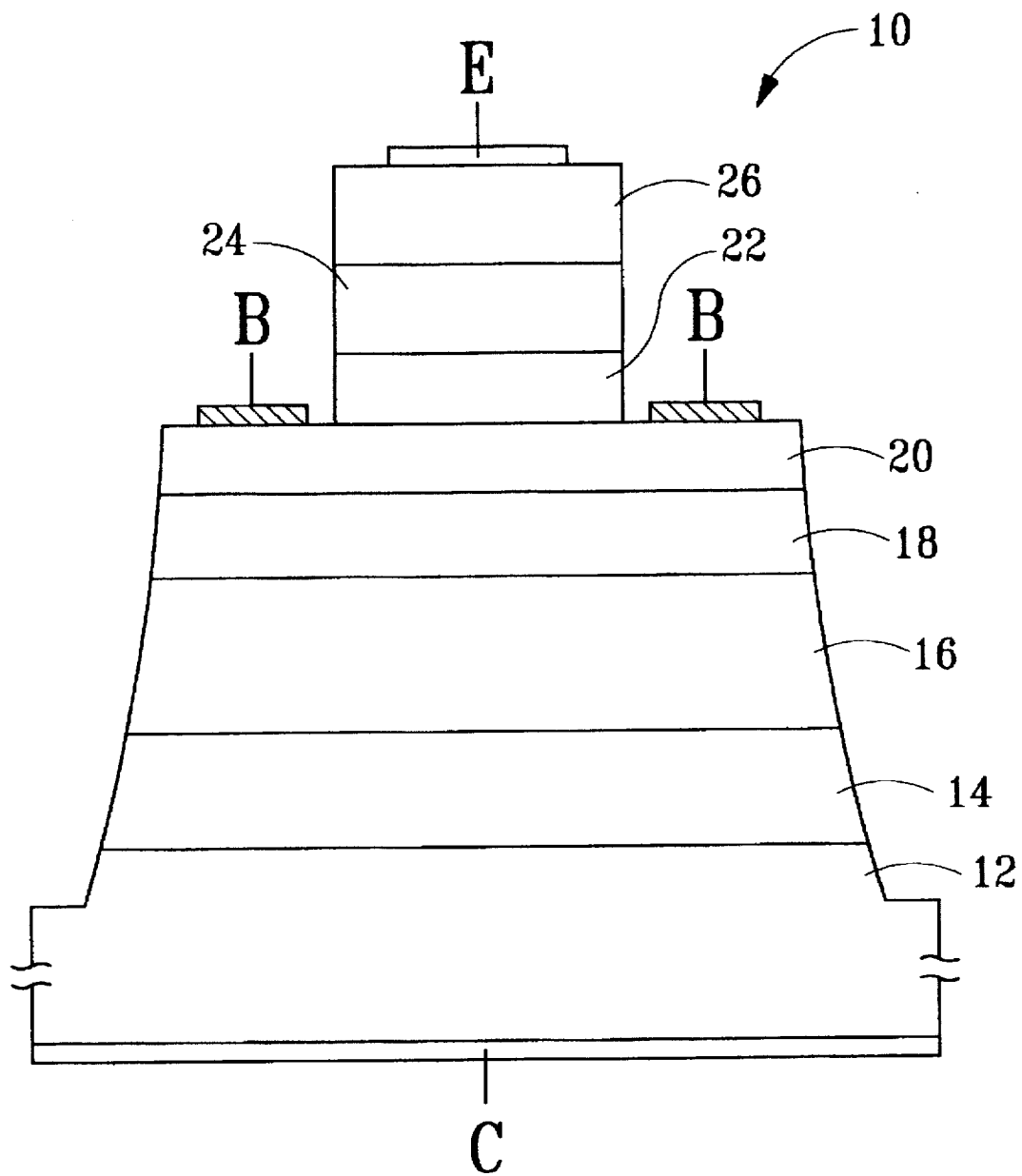
FIG. 1 is a schematic crosssection of the structure of the heterostructure-emitter and heterostructure-base bipolar transistor of the invention.

FIG. 1 shows a practical example of the heterostructure-emitter and heterostructure-base transistor of the invention whose structure consists of, from bottom upward in sequence, an $n^+$-type GaAs substrate 12; an $n^+$-type GaAs buffer layer 14 with thickness of 5000é and doped concentration of $3\times10^{18}$ cm$^{-3}$; an $n^{31}$,-type GaAs collector layer with 16 of thickness of 5000é and doped concentration of $5\times10^{16}$ cm$^{-3}$; a $p^+$-type GaAs base layer 18 with thickness of 1000é and doped concentration of $1\times10^{19}$ cm$^{-3}$; a $p^+$-type $In_{0.2}Ga_{0.8}As$ quantum well 20 with thickness of 100é and doped concentration of $1\times10^{19}$ cm$^{-3}$; an n-type GaAs emitter layer 22 with thickness 500é and doped of concentration 5×10$^{17}$ cm$^{-3}$; an n-type AlGaAs confinement layer 24 with thickness of 1000é and doped concentration of 5×10$^{17}$ cm$^{-3}$; and an n$^+$-type GaAs ohmic contact layer 26 with thickness of 3000é and doped concentration of 3×10$^{18}$ cm$^{-3}$.

Figure 2:
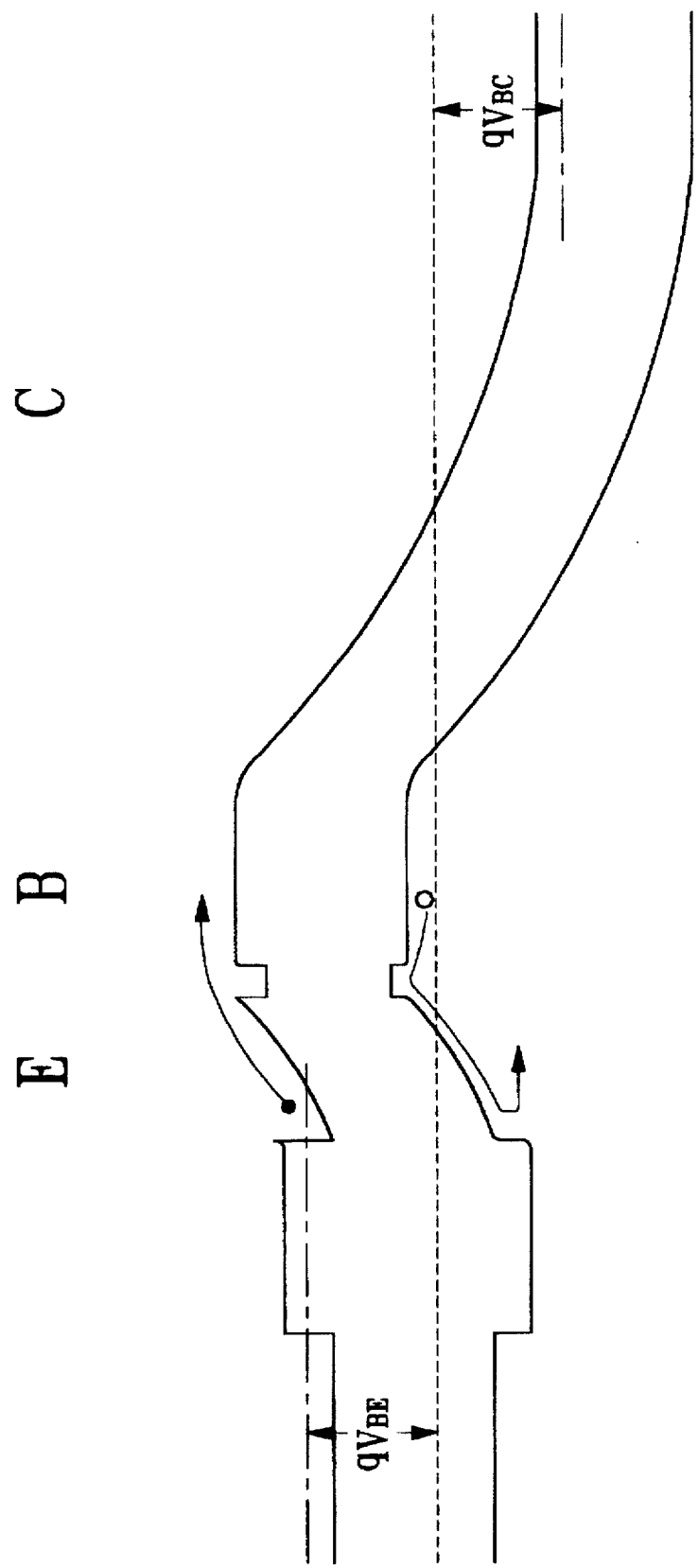
FIG. 2 is the energy band diagram of the heterostructure-emitter and heterostructure-base bipolar transistor of the invention under normal operation mode.
Figure 3:
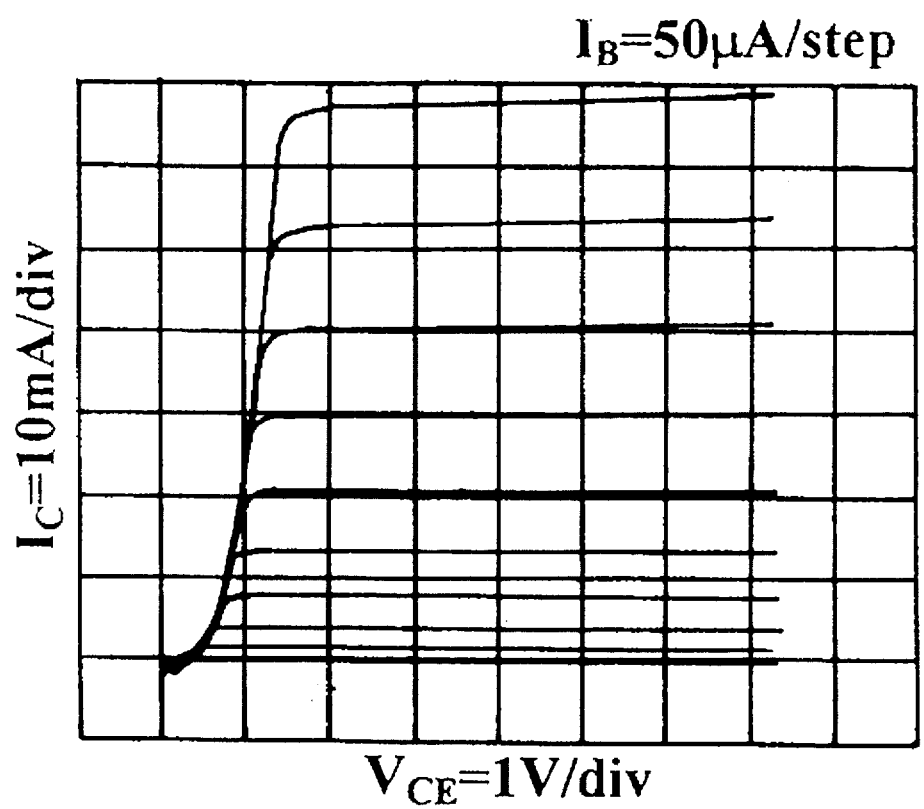
FIG. 3 is the characteristic curves of current vs voltage of the heterostructure-emitter and heterostructure-base bipolar transistor of the invention.
Figure 4A:
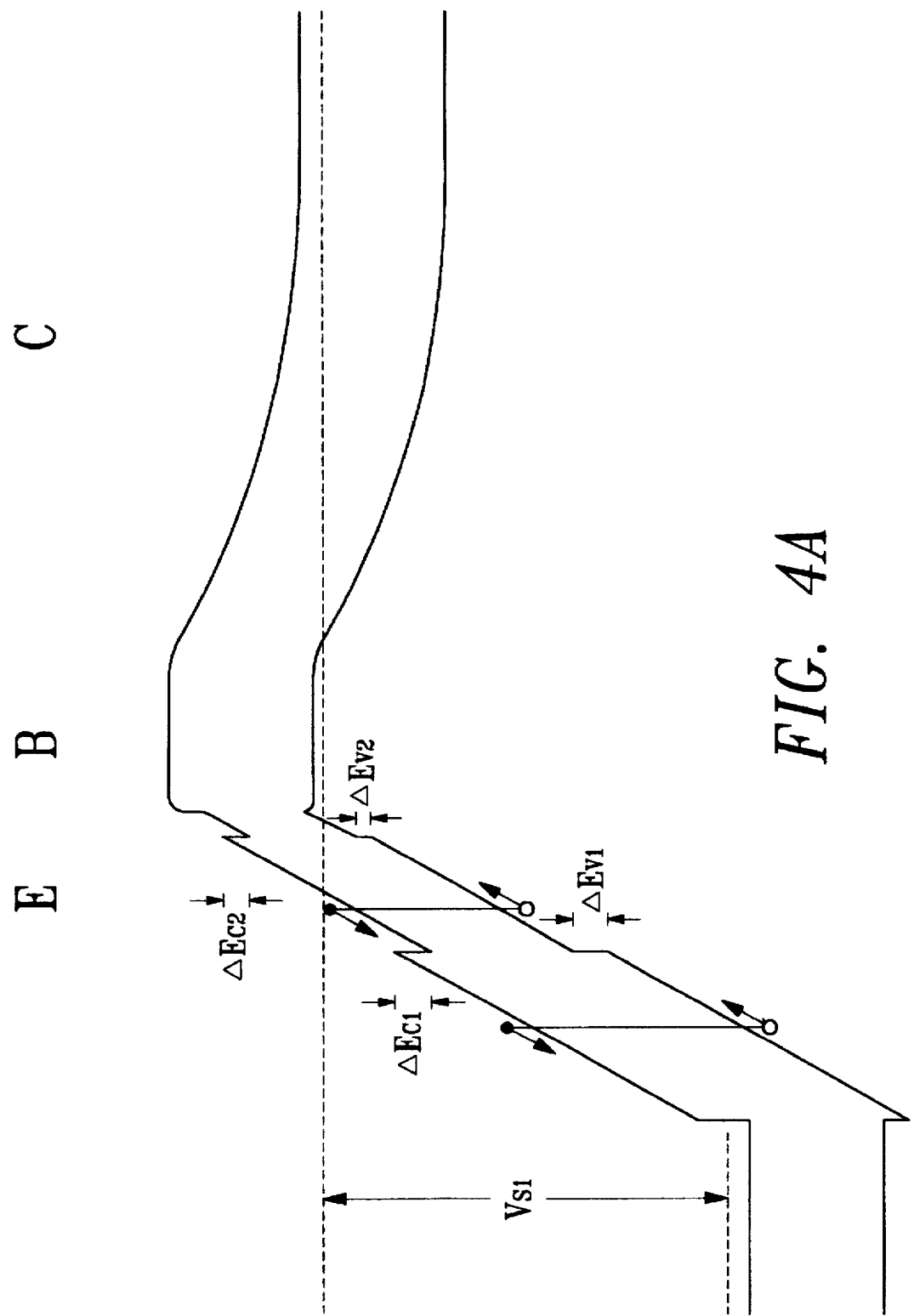
FIG. 4A is the energy band diagram of the HEHBT of the invention under inverted operation mode. As the external voltage ($V_{EC}$) is sufficiently large, an avalanche multiplication occurs at the interface between the emitter and base.
Figure 4B:
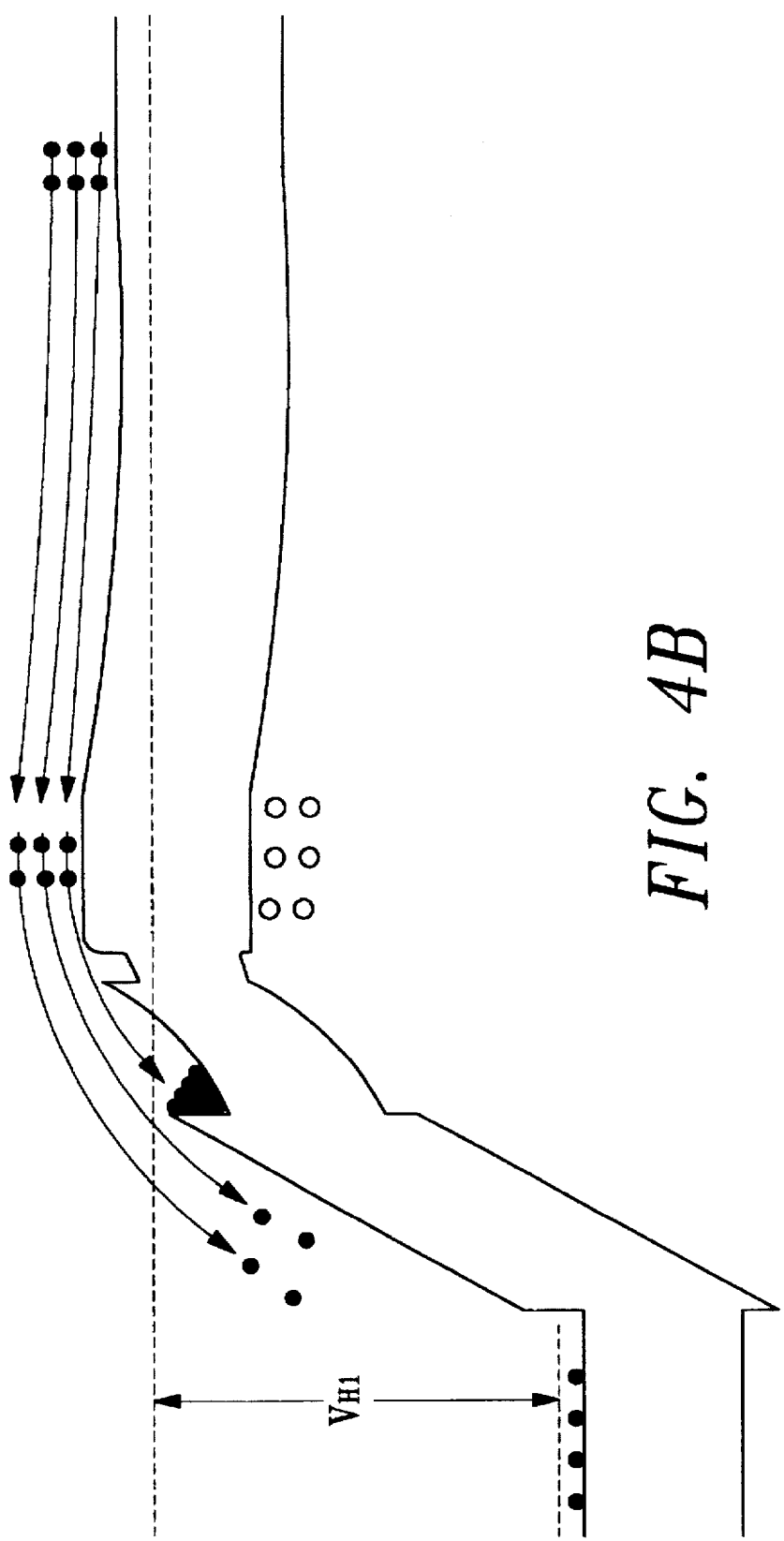
FIG. 4B is the energy band diagram of the HEHBT of the invention under inverted operating mode. The first S-shaped negative-differential-resistance phenomenon appears due to the rapid increase of conduction current caused by the reduction of potential barrier height.
Figure 4C:
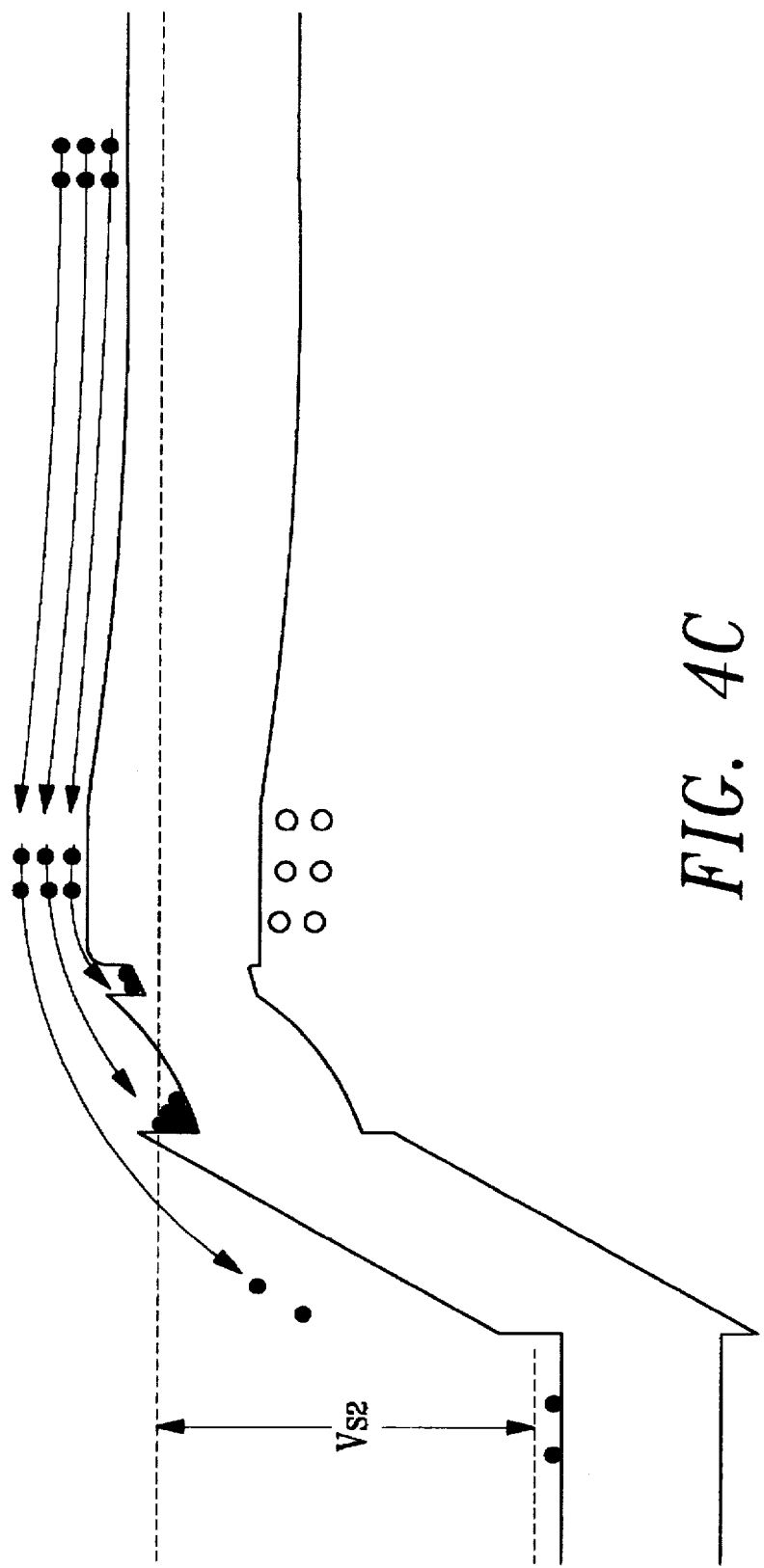
FIG. 4C is the energy band diagram of the HEHBT of the invention under inverted operation mode. The second S-shaped negative-differential-resistance phenomenon is caused by another potential barrier lowering effect.
Figure 4D:
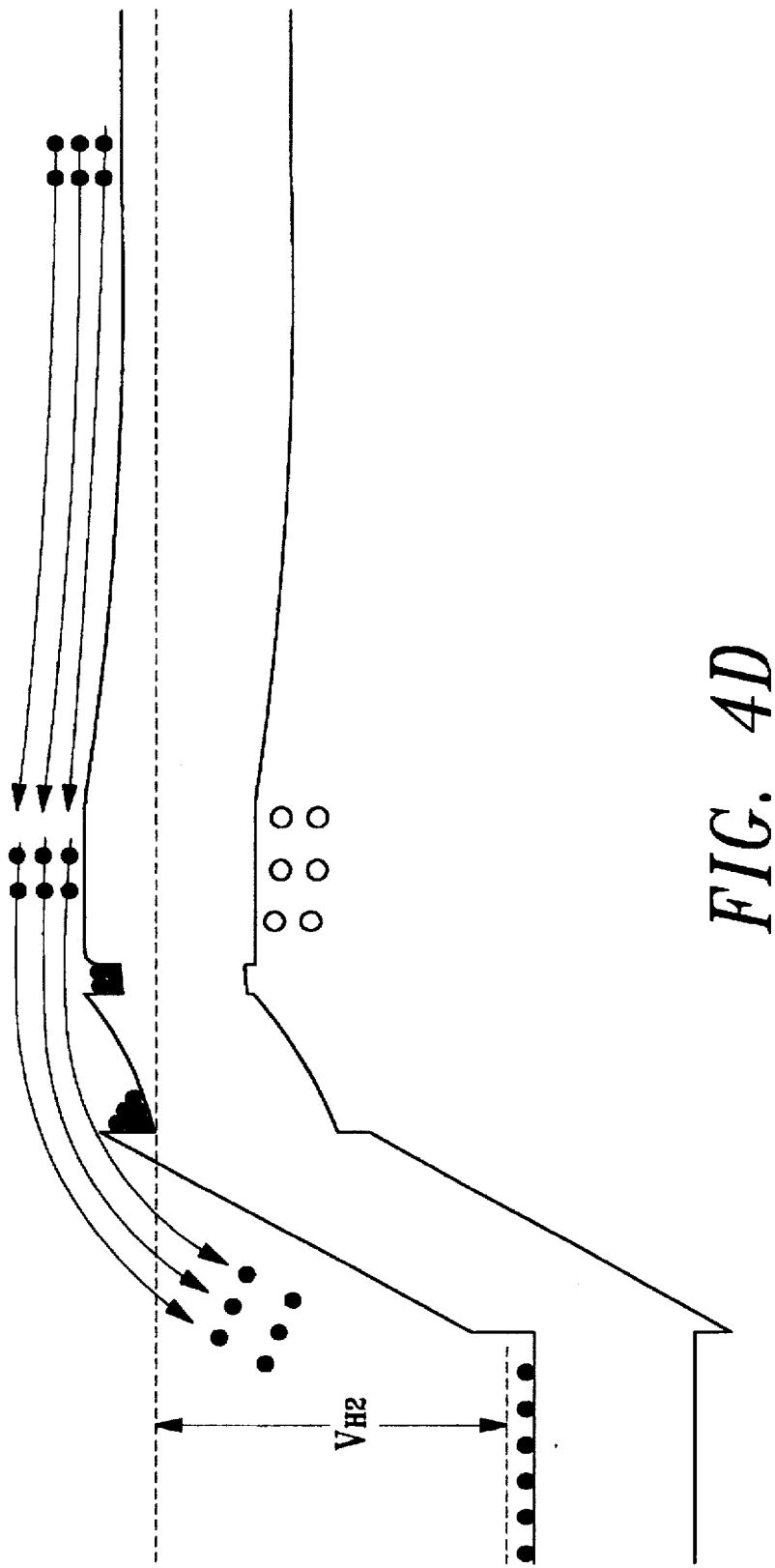
FIG. 4D is the energy band diagram of the HEHBT of the invention under inverted operation mode. The transistor consequently works in final on-state after the two-stage potential barrier lowering.

Under normal operation mode, due to the presence of heterostructure emitter (e.g., GaAs emitter layer 22 and AlGaAs confinement layer 24), most of minority carriers (holes) injected from base to emitter are reflected back by AlGaAs confinement layer before they can recombine with electrons. The corresponding energy band diagrams are illustrated in FIG. 2. Furthermore, due to the presence of InGaAs QW, the effective valence band discontinuity ($\Delta E_v$) at E-B heterojunction is increased giving rise to more confinement effect for holes. Thus, the emitter injection efficiency and current gain will be increased. Because the surface recombination velocity of InGaAs is smaller than that of GaAs the collector-emitter offset voltage ($\Delta V_{CE}$) can be reduced significantly when the base metal are deposited on InGaAs quantum well QW. This results in a larger current gain and lower power consumption. FIG. 3 shows the output current-voltage (I-V) characteristics of the device under normal operation mode. A typical current gain of 280 and an offset voltage lower than 100 mV are obtained.

Figure 5:
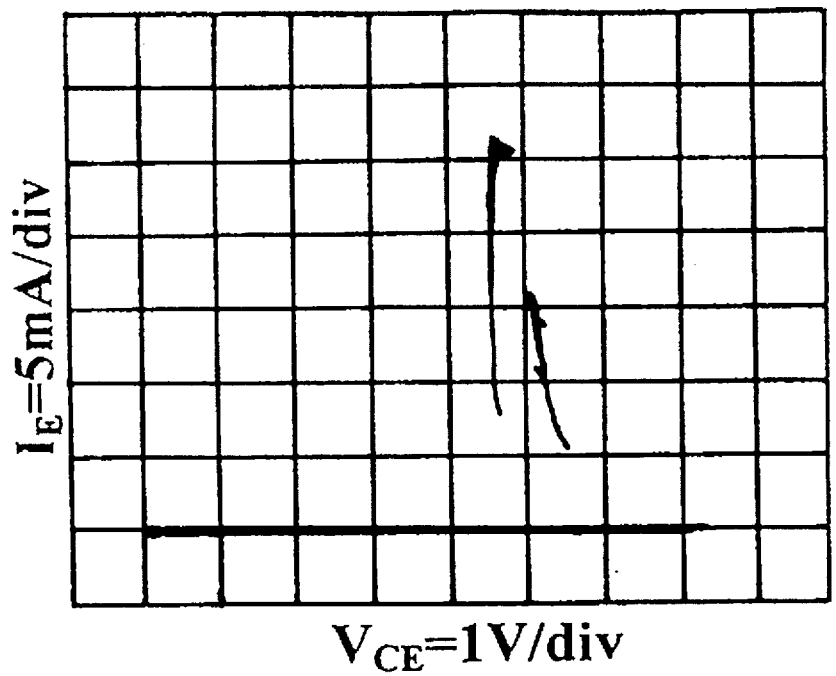
FIG. 5 is the characteristic curves of current vs voltage of the HEHBT of the invention under inverted operation mode.

The corresponding energy band diagrams under the inverted operation mode are illustrated in FIG. 4. When the applied $V_{EC}$ voltage increases sufficiently, an avalanche multiplication will be observed near the reverse biased E-B junction which produces a large amount of electron-hole pairs as revealed in FIG. 4(a). Holes, created by the avalanche multiplication, transport toward base region and charge the depletion region of base-collector(B-C)junction and an ion screen effect is caused. This suppresses the potential barrier height for electron injection. So, more electrons are easier to transport over base toward emitter region. Because the magnitude of conduction band discontinuity at AlGaAs/GaAs interface ($\Delta E_{C1}$) is much larger than at GaAs/InGaAs interface ($\Delta E_{C2}$), most of electrons injecting from collector through base can easily travel over InGaAs QW and part of these electrons may accumulate at AlGaAs/GaAs heterointerface. This accumulation of electrons may elevate up the energy band structure near the emitter side and cause more electrons transporting from collector to emitter. From this regenerative-loop feedback, the conduction current is increased rapidly and an intermediate on-state of carrier transport characteristics is established as shown in FIG. 4(b). Once the barrier height of base regime is lowered, the confinement effect of $\Delta E_{C2}$ becomes relatively significant. Hence, the electrons are continuously confined at InGaAs QW with the increase of conduction current. At some current level, the sufficiently accumulated electrons will cause the second barrier lowering effect as illustrated in FIG. 4(c). This will yield the final on-state of carrier transport and rapid increase of conduction current as revealed in FIG. 4(d). The experimental I-V characteristic of the studied device under inverted operation mode is shown in FIG. 5. Obviously, the interesting multiple S-shaped NDR phenomena are observed in FIG. 5. It is known that, from the above description, the invention can improve the transistor performances such as the higher emitter injection efficiency, the high current gain, the lower collector-emitter offset voltage, and the lower power consumption. In addition, the interesting double S-shaped NDR phenomena is obtained when the device is suited inverted operation mode. This provide the good potentiality in the multiple-valued logic circuit applications. Consequently, the HEHBT device of the invention is uited for amplification, oscillator, and multiple-valued logic circuit applications. This device can efficiency improve the transistor performances and extend the application scope.

REFERENCE DOCUMENTS

1. W. C. Liu and W. S. Lour," An improve heterostructure-emitter bipolar transistor(HEBT)," IEEE Electron Device Lett., vol. 12, pp. 474–476, 1991
2. T. Tanoue, H. Mizuta, and S. Takahaski," A triple-well resonant-tunneling diode for multiple-valued logic application,' IEEE Electron Device Lett., vol. EDL-9, pp.365–367, 1988.
3. C. R. Liu, Y. K. Fang, J. D. Hwang, and K. H. Chen," A novel amorphous sillicon dopion superlattice with double switching characteristics for multiple-valued logic applications," IEEE Electron Device Lett., vol. EDL-14, pp. 391–393, 1993.
4. S. S. Lu and C. C. Wu," High current gain small offset voltage InGaP/GaAs tunneling emitter bipolar transistor grown by gas sottree molecular epitaxy," IEEE Electron Device Lett., vol. EDL-13, no. 19, pp. 468–470, 1992.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A heterostructure-emitter and heterostructure-base transistor comprising:

a highly-doped n$^+$-type GaAs substrate;

an n$^+$-type GaAs buffer layer on said substrate;

an n$^-$-type GaAs collector layer on said buffer layer;

a p$^+$-type GaAs base layer on said collector layer;

a p$^+$-type InGaAs quantum well on said base layer;

an n-type GaAs emitter layer on said quantum well;

an n-type AlGaAs confinement on said emitter layer; and an n$^+$-type GaAs ohmic contact layer on said confinement layer, wherein said emitter layer and said confinement layer are of a heterostructure and said base layer and said quantum well are of a heterostructure, wherein, under a normal operation mode, the transistor has high current gain and low offset voltage to reduce power consumption, and, under an inverted-mode, produces multiple S-shaped negative-differential resistance by means of avalanche multiplication and two-stage successive confinement effect of carriers at room temperature.

2. A heterostructure-emitter and heterostructure-base transistor according to claim 1, wherein said n$^+$-type GaAs buffer layer has a thickness of 5000 Å and a doped concentration of 3×10$^{18}$ cm$^{-3}$.

3. A heterostructure-emitter and heterostructure-base transistor according to claim 1, wherein said n$^-$-type GaAs collector layer has a thickness of 5000 Å and a doped concentration of 5×10$^{16}$ cm$^{-3}$.

4. A heterostructure-emitter and heterostructure-base transistor according to claim 1, wherein said p$^+$-type GaAs base layer has a thickness of 1000 Å and a doped concentration of 1×10$^{19}$ cm$^{-3}$.

5. A heterostructure-emitter and heterostructure-base transistor according to claim 1, wherein said p$^+$-type InGaAs quantum well is an $In_{0.2}Ga_{0.8}As$ material with a thickness of 100 Å and a doped concentration of 1×10$^{19}$ cm$^{-3}$.

6. A heterostructure-emitter and heterostructure-base transistor according to claim 1, wherein said n-type GaAs emitter layer has a thickness of 500 Å and a doped concentration of $5 \times 10^{17}$ cm$^{-3}$.

7. A heterostructure-emitter and heterostructure-base transistor according to claim 1, wherein said confinement layer is an n-type $Al_{0.45}Ga_{0.55}As$ material with a thickness of 1000 Å and a doped concentration of $5 \times 10^{17}$ cm$^{-3}$.

8. A heterostructure-emitter and heterostructure-base transistor according to claim 1, wherein said n$^+$-type GaAs ohmic contact layer has a thickness of 3000 Å and a doped concentration of $3 \times 10^{18}$ cm$^{-3}$.

* * * * *